United States Patent
Pelletier et al.

(10) Patent No.: US 10,830,638 B2
(45) Date of Patent: Nov. 10, 2020

(54) PHOTODETECTOR CIRCUIT WITH IMPROVED SATURATION CURRENT AND INTEGRATED OPTICAL FILTERING

(71) Applicant: Ciena Corporation, Hanover, MD (US)

(72) Inventors: Francois Pelletier, Quebec (CA); Michel Poulin, Quebec (CA); Yves Painchaud, Quebec (CA); Michael Vitic, Quebec (CA); Christine Latrasse, Quebec (CA); Alexandre Delisle-Simard, Quebec (CA)

(73) Assignee: Ciena Corporation, Hanover, MD (US)

( * ) Notice: Subject to any disclaimer, the term of this patent is extended or adjusted under 35 U.S.C. 154(b) by 208 days.

(21) Appl. No.: 16/015,678

(22) Filed: Jun. 22, 2018

(65) Prior Publication Data

US 2019/0391006 A1 Dec. 26, 2019

(51) Int. Cl.
*G01J 1/04* (2006.01)
*G01J 1/44* (2006.01)
*H04B 10/61* (2013.01)
*H01L 31/028* (2006.01)
*H01L 31/109* (2006.01)

(52) U.S. Cl.
CPC .............. *G01J 1/0425* (2013.01); *G01J 1/44* (2013.01); *H04B 10/615* (2013.01); *H04B 10/65* (2020.05); *G01J 2001/446* (2013.01); *H01L 31/028* (2013.01); *H01L 31/109* (2013.01)

(58) Field of Classification Search
CPC ...... G01J 1/0425; G01J 1/44; G01J 2001/446; H04B 10/611; H04B 10/615; H01L 31/028; H01L 31/109
See application file for complete search history.

(56) References Cited

U.S. PATENT DOCUMENTS 5,675,151 A * 10/1997 Oka .................. G01T 1/201
250/366
9,978,890 B1 * 5/2018 Bayn ................. G02B 6/12

OTHER PUBLICATIONS

S. Murthy et al., "Parallel feed travelling wave distributed pin photodetectors with integrated MMI couplers", Electron. Lett., vol. 38, No. 2, pp. 78-80, Jan. 17, 2002 (3 pages).

(Continued)

*Primary Examiner* — Georgia Y Epps
*Assistant Examiner* — Don J Williams
(74) *Attorney, Agent, or Firm* — Clements Bernard Walker; Lawrence A. Baratta, Jr.; Christopher L. Bernard

(57) ABSTRACT

A photodetector circuit is disclosed. The photodetector circuit includes an optical input configured to receive a source optical signal for detection by the photodetector circuit, an optical waveguide for coupling the optical input and at least one side of a plurality of sides of a photodiode, wherein the optical waveguide is configured to generate a first optical signal and a second optical signal from the source optical signal, and the photodiode coupled to the first optical waveguide, where the photodiode is illuminated on the at least one side by the first and second optical signals at different locations on the photodiode, where the photodiode generates a photocurrent based on the first and second optical signals reducing photocurrent saturation. Providing a delay between the first and second optical signals reduces an out-of-band frequency response of the photodiode circuit.

20 Claims, 11 Drawing Sheets

(56) References Cited

OTHER PUBLICATIONS

S. Murthy et al., "A Novel Parallelly-fed Traveling Wave Photodetector with Integrated MMI Power Splitter", Optical Fiber Communication Conference, WM24, pp. 281-283, Mar. 2000 (3 pages).

C. Chang et al., "High-power dual-fed traveling wave photodetector circuits in silicon photonics", Opt. Express, vol. 23, No. 17, p. 22857-22866, 2015 (10 pages).

* cited by examiner

PHOTODETECTOR CIRCUIT WITH IMPROVED SATURATION CURRENT AND INTEGRATED OPTICAL FILTERING

BACKGROUND

A waveguide is an optoelectronic component having a physical structure that confines and guides the propagation of an electromagnetic (EM) wave, such as a light beam carrying an optical signal. A mode is an electromagnetic (EM) field pattern in the waveguide. A multi-mode interferometer (MMI) is a waveguide with multiple guided propagation modes that propagate along the waveguide independently from each other. The multiple guided propagation modes propagate at different velocities to result in an interference pattern that changes along the length of the MMI.

Detection of light in a photodiode involves the generation of electron-hole pairs. The generated electrons and holes are directed towards the cathode and anode of the photodiode respectively which are kept at positive and negative potentials using a reverse bias voltage. This bias voltage ensures that the generated (electrons and holes) charges are swept rapidly towards the photodiode metal electrodes (the anode and cathode), leading to high bandwidth operation. Before the electron-hole pairs reach the metal electrodes, they themselves produce an electric field which is in the opposite direction to that created by the externally applied bias voltage. When the amount of light shone on the photodiode is large, the electric field induced by the many electron-hole pairs becomes significant and cancels partly and significantly the externally applied field, a phenomenon known as the charge screening effect. When this screening occurs, the charge diffusion time increases which in turn increases the probability that the electron-hole pairs recombine, preventing them from contributing to the current output by the photodiode. The bias voltage screening by the generated charges thus leads to decreased photocurrent and to a smaller bandwidth of operation of the photodiode.

Gridless networking maximizes data throughput per fiber with improved channel packing of an intradyne coherent receiver. However, when the local oscillator (LO) beats with a particular wavelength, the receiver not only picks up the desired channel but also all of its neighbors (i.e., out-of-band channels).

SUMMARY

In general, in one aspect, the invention relates to a photodetector circuit. The photodetector circuit includes an optical input configured to receive a source optical signal for detection by the photodetector circuit, a first optical waveguide for coupling the optical input and at least one side of a plurality of sides of a photodiode, wherein the first optical waveguide is configured to generate a first optical signal and a second optical signal from the source optical signal, and the photodiode coupled to the first optical waveguide and having the plurality of sides, where the photodiode is illuminated on the at least one side by the first and second optical signals at different locations on the photodiode, where the photodiode generates a photocurrent based on the first and second optical signals reducing photocurrent saturation.

In one or more embodiments, the first optical waveguide is coupled to the at least one side via a plurality of delay elements, the plurality of delay elements comprise a delay difference that induces a frequency dependent phase shift of the first optical signal and the second optical signal, and illuminating the photodiode with the first and second optical signals reduces an out-of-band frequency response of the photocurrent based on the frequency dependent phase shift.

In general, in one aspect, the invention relates to an optical receiver. The optical receiver includes a photodetector circuit and an amplifier circuit that is configured to detect photocurrent and to generate a voltage output of the optical receiver. The photodetector circuit includes an optical input configured to receive a source optical signal for detection by the photodetector circuit, an optical waveguide for coupling the optical input and at least one side of a plurality of sides of a photodiode, where the optical waveguide is configured to generate a first optical signal and a second optical signal from the source optical signal, and the photodiode coupled to the optical waveguide and having the plurality of sides, where the photodiode is illuminated on the at least one side by the first and second optical signals at different locations on the photodiode, where the photodiode generates the photocurrent based on the first and second optical signals reducing photocurrent saturation.

In general, in one aspect, the invention relates to a method for manufacturing a photodetector circuit. The method includes providing a substrate for the photodetector circuit, forming an optical waveguide disposed on the substrate, and coupling the optical waveguide with a photodiode, where the optical waveguide is configured to transmit a first optical signal and a second optical signal to the photodiode at different locations on the photodiode reducing photocurrent saturation.

In one or more embodiments, coupling the optical waveguide with the photodiode includes coupling the optical waveguide to a side of a plurality of sides of the photodiode via a plurality of delay elements, selecting an optical power ratio, among a plurality of optical power ratios, between first and second optical signals of a plurality of optical signals, and selecting a delay difference of the plurality of delay elements to induce a frequency dependent phase shift of the first and second optical signals for reducing an out-of-band frequency response of the photodetector circuit.

Other aspects of the invention will be apparent from the following description and the appended claims.

BRIEF DESCRIPTION OF DRAWINGS

Specific embodiments disclosed herein will now be described in detail with reference to the accompanying figures. Like elements in the various figures are denoted by like reference numerals for consistency.

DETAILED DESCRIPTION

Figure 1:
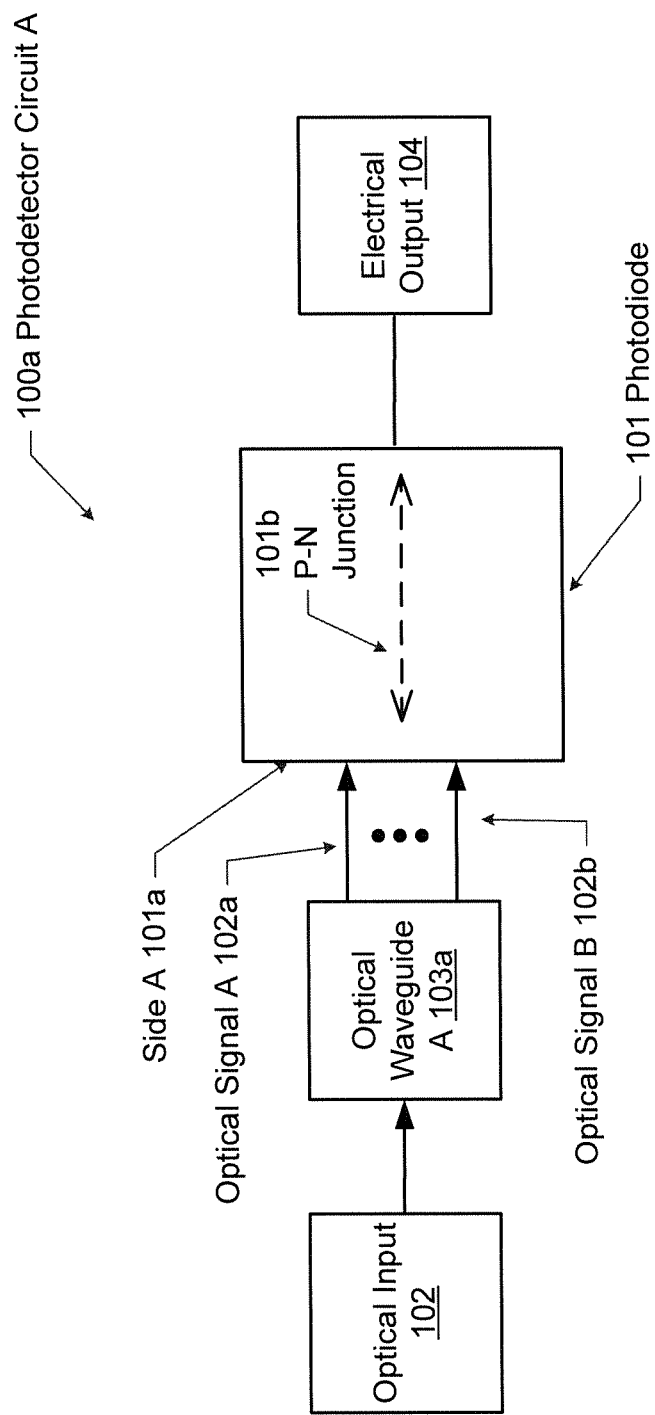
FIGS. 1 and 2 show schematic diagrams in accordance with one or more embodiments disclosed herein.

In the following detailed description of embodiments, numerous specific details are set forth in order to provide a more thorough understanding of the disclosure. However, it will be apparent to one of ordinary skill in the art that one or more embodiments may be practiced without these specific details. In other instances, well-known features have not been described in detail to avoid unnecessarily complicating the description.

In the following description, any component described with regard to a figure, in various embodiments disclosed herein, may be equivalent to one or more like-named components described with regard to any other figure. For brevity, at least a portion of these components is implicitly identified based on various legends. Further, description of these components will not be repeated with regard to each figure. Thus, each and every embodiment of the components of each figure is incorporated by reference and assumed to be optionally present within every other figure having one or more like-named components. Additionally, in accordance with various embodiments, any description of the components of a figure is to be interpreted as an optional embodiment which may be implemented in addition to, in conjunction with, or in place of the embodiments described with regard to a corresponding like-named component in any other figure. In the figures, three black solid collinear dots indicate that additional components similar to the components before and after the solid collinear dots may optionally exist.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments disclosed herein provide a number of implementations for illuminating a photodiode. In one or more embodiments, the implementations reduce the saturation effect in germanium-on-silicon photodiodes by either using multiple optical input ports on at least one side of the photodiode, or using a truncated MMI, or a MMI section, providing improved uniform illumination across the photodiode entrance face. In particular, the implementations reduce the peak intensity within the active area (e.g., germanium) to reduce the charge screening effect. The reduced peak intensity in turn reduces the local density of electron-hole pairs within the photodiode to mitigate the bias voltage screening effect. For clarity, the reduced local density of electron-hole pairs enables the effect of a greater number of electron-hole pairs to be output as photocurrent for the same amount of optical power incident on the photodiode. The apparatus and methods proposed herein are also understood as increasing dynamic range of signal detection.

Throughout this disclosure, the terms "light," "light beam," "signal," and "optical signal" may be used interchangeably unless explicitly stated otherwise. Those skilled in the art will appreciate that a signal generally refers to something carrying information, and that therefore, a signal may be carried by light in various forms (e.g. a lightwave, etc.).

Embodiments disclosed herein further provide a number of implementations for shaping the spectral response of the photodetector. Specifically, one or more schemes reduces an out-of-band frequency response of the photodetector. The implementations reduce the out-of-band frequency response by inducing a frequency dependent phase shift between optical signals illuminating the photodiode. For example, the optical signals are coupled to the photodiode using optical waveguides having different optical signal propagation delays.

FIG. 1 shows a diagram of a photodetector circuit A (100a) in accordance with one or more embodiments disclosed herein.

Figure 4C:
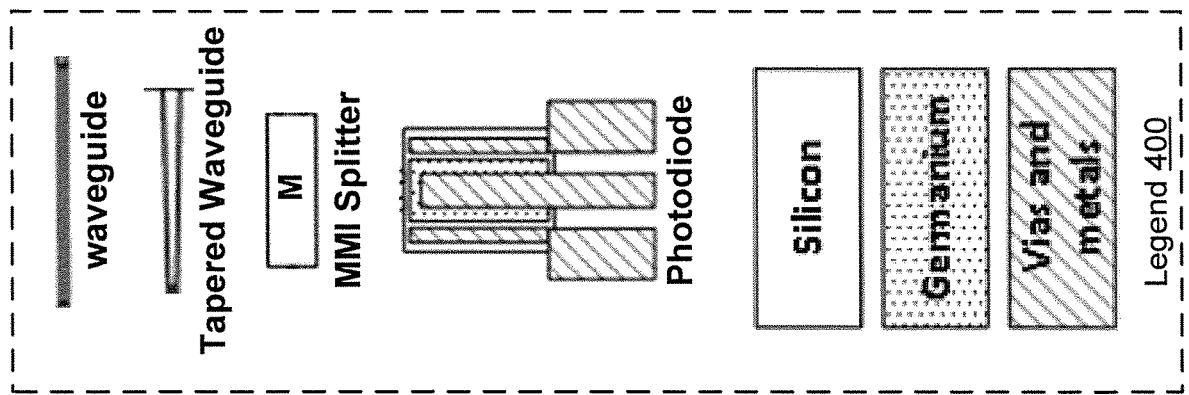
FIGS. 4A, 4B, 4C, 5, 6, 7, 8A, 8B, and 9 show examples in accordance with one or more embodiments disclosed herein.
Figure 4C:
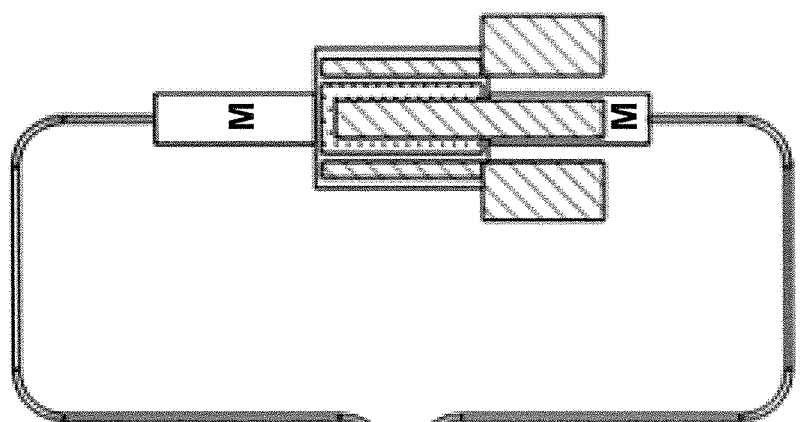

As shown in FIG. 1, photodetector circuit A (100a) includes an optical input (102), an optical waveguide A (103a), a photodiode (101), and an electrical output (104). In one or more embodiments, the optical input (102) is configured to receive a source optical signal for detection by the photodetector circuit A (100a). For example, the optical input (102) may be an input of the optical waveguide, such as an optical fiber. Optical waveguide A (103a) couples the optical input (102) to one of multiple sides (or faces) (e.g., side A (101a)) of the photodiode (101). For example, side A (101a) may be a front or a back side of the photodiode (101). Alternatively, side A (101a) may be a top side of the photodiode (101). In one or more embodiments, optical waveguide A (103a) is coupled to side A (101a) via intervening components, such as one or more additional waveguides, MMIs, truncated MMIs, interferometers per se, etc. An example of such embodiments is depicted in FIG. 4A described below. In one or more embodiments, optical waveguide A (103a) is butt-coupled to side A (101a). In other words, the optical waveguide A (103a) is physically attached directly to the side of the photodiode. As used throughout this disclosure, the term "butt-coupled" refers to the physical connection configuration where light is carried in the silicon waveguide which suddenly ends, so that light enters directly into the germanium area adjacent to it (or into whatever material is used for the active area where optical absorption takes place). Light can also be evanescently coupled to the active area (e.g. germanium) such as in germanium-on-silicon (Ge-on-Si) photodiodes, where the light propagating in the underlying silicon layer can be transferred into the upper germanium layer and be absorbed. As a further example, light can also be traveling into a silicon nitride waveguide (or any other type of waveguide) disposed above and in close proximity to the germanium region. With a sufficiently small distance between the overhanging waveguide and the germanium area, the light can be evanescently coupled into the active germanium region. Throughout this disclosure, the term "coupled" may include both butt-coupled configuration and evanescently coupled configuration unless explicitly stated otherwise. In one or more embodiments, optical waveguide A (103a) may be a tapered waveguide that is coupled to side A (101a). FIG. 4A described below includes an example of such embodiments.

In one or more embodiments, optical waveguide A (103a) is configured to generate multiple optical signals (e.g., optical signal A (102a), optical signal B (102b)) from the source optical signal. For example, optical waveguide A (103a) may be a multimode interference splitter or any other suitable type of beam splitter. In one or more embodiments, the multiple optical signals (e.g., optical signal A (102a), optical signal B (102b)) are optical beams propagating in separate physical media, such as separate waveguides. In one or more embodiments, optical waveguide A (103a) is a multi-mode device, such as a multi-mode interferometer (MMI). In such embodiments, optical signal A (102a) and optical signal B (102b) are associated with different propagation modes propagating in a single MMI.

In one or more embodiments, each optical signal (e.g., optical signal A (102a), optical signal B (102b)) is transmitted by optical waveguide A (103a) to an optical input port of the photodiode (101). An optical port corresponds to a surface location of the photodiode (101) that receives input optical signals. The photodiode (101) may have multiple optical input ports. For example, each optical input port may correspond to a particular position on side A (101*a*) where the particular position is connected to an intervening optical waveguide from the optical waveguide A (103*a*). In one or more embodiments, optical signal A (102*a*) and optical signal B (102*b*) may each be coupled to different positions across side A (101*a*) of the photodiode (101). That is, the optical signals (102*a*, 102*b*) may be sent to multiple optical input ports on at least one side A (101*a*) of the photodiode (101).

In one or more embodiments, the photodiode (101) has a germanium region and a silicon region, doped appropriately to form a pn (or a p-i-n) junction (101*b*). In other embodiments, the photodiode (101) has a germanium region, doped appropriately to form a pn (or a p-i-n) junction (101*b*). The p-n junction (101*b*) is schematically represented as a dashed arrow without depicting physical structures. A p-n junction is a boundary or interface between a p-type region and an n-type region of semiconductor material. The p-type region and the n-type region (referred to as doped regions) are created by selectively doping (e.g., via an ion implantation process, diffusion process, epitaxy process, etc.) the semiconductor material using a p-type dopant or an n-type dopant, respectively. An intrinsic region may be used between the p-doped region and n-doped region to form a p-i-n photodiode instead. Throughout this disclosure, the p-i-n photodiode is referred to as a special configuration of the pn photodiode. In other words, the terms "pn junction" and "p-i-n junction" may be used interchangeably unless explicitly stated otherwise. Depending on the relative orientation of the interface with respect to the side A (101*a*), side A (101*a*) may be in the germanium region, in the silicon region, or intersect with the p-n junction (101*b*) and extend through both regions. As shown in FIG. 1, the photodiode (101) is illuminated on side A (101*a*) by optical signal A (102*a*) and optical signal B (102*b*) to cause the p-n junction (101*b*) to generate a photocurrent. Each of optical signal A (102*a*) and optical signal B (102*b*) contributes to a portion of the output photocurrent. In one or more embodiments, the output photocurrent is used as an input to an amplifier circuit (not shown) to generate the electrical output (104) of the photodetector circuit A (100*a*). For example, the electrical output (104) may have a voltage magnitude or a current magnitude that represents the source optical signal.

Figure 5:
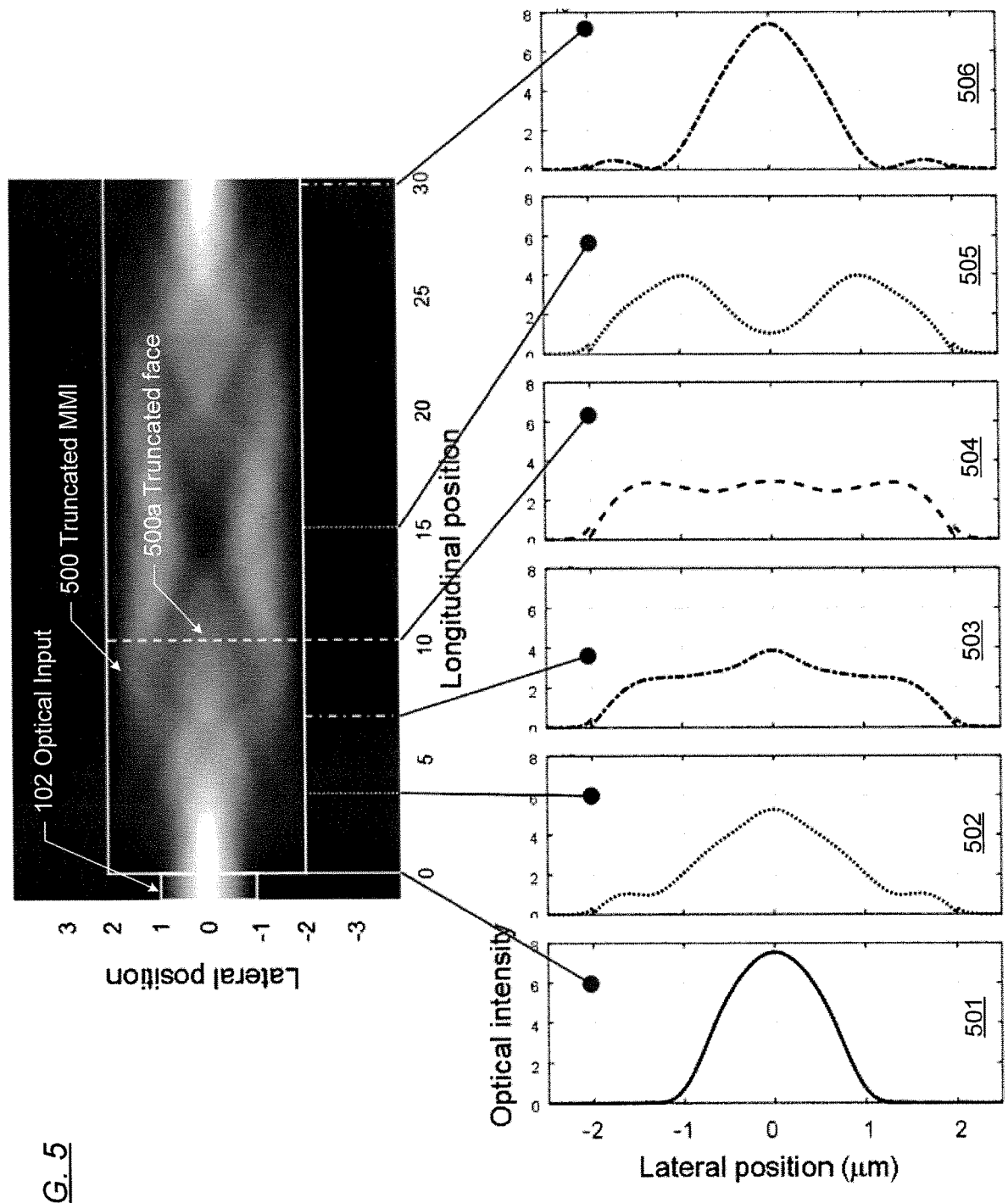

As noted above, the light from optical waveguide A (103*a*) may be coupled (e.g., butt-coupled or evanescently coupled) to side A (101*a*) of the photodiode. In one or more embodiments, the coupled optical waveguide A (103*a*) generates optical signal A (102*a*) and optical signal B (102*b*) with different propagation modes. The propagation modes collectively form a light intensity distribution across side A (101*a*). In one or more embodiments, the length of optical waveguide A (103*a*) is selected to increase uniformity of the light intensity distribution across side A (101*a*). In particular, the length is along a light propagation direction from the optical input (102) to side A (101*a*). An example of such embodiments is depicted in FIG. 5 described below.

Figure 6:
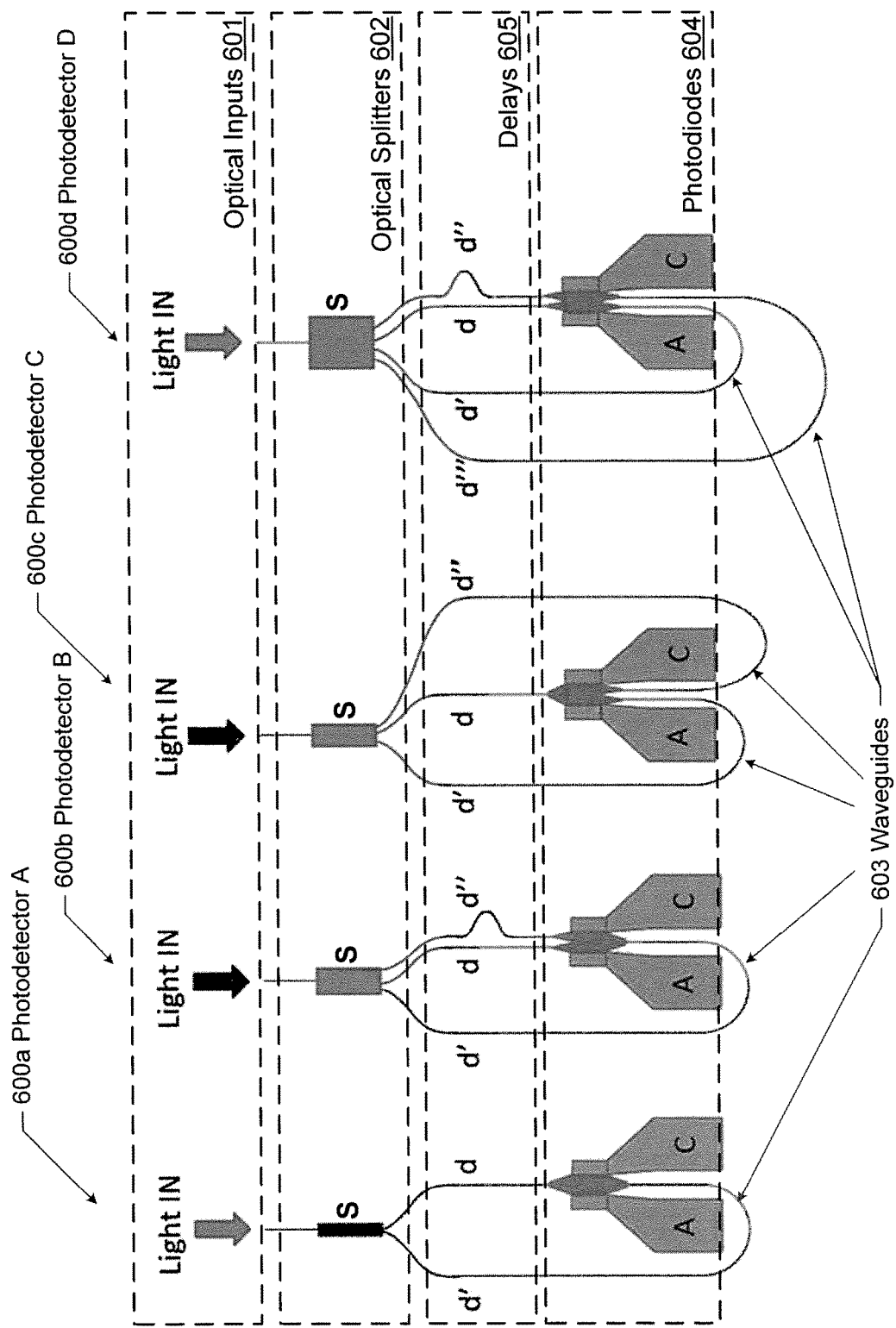
Figure 7:
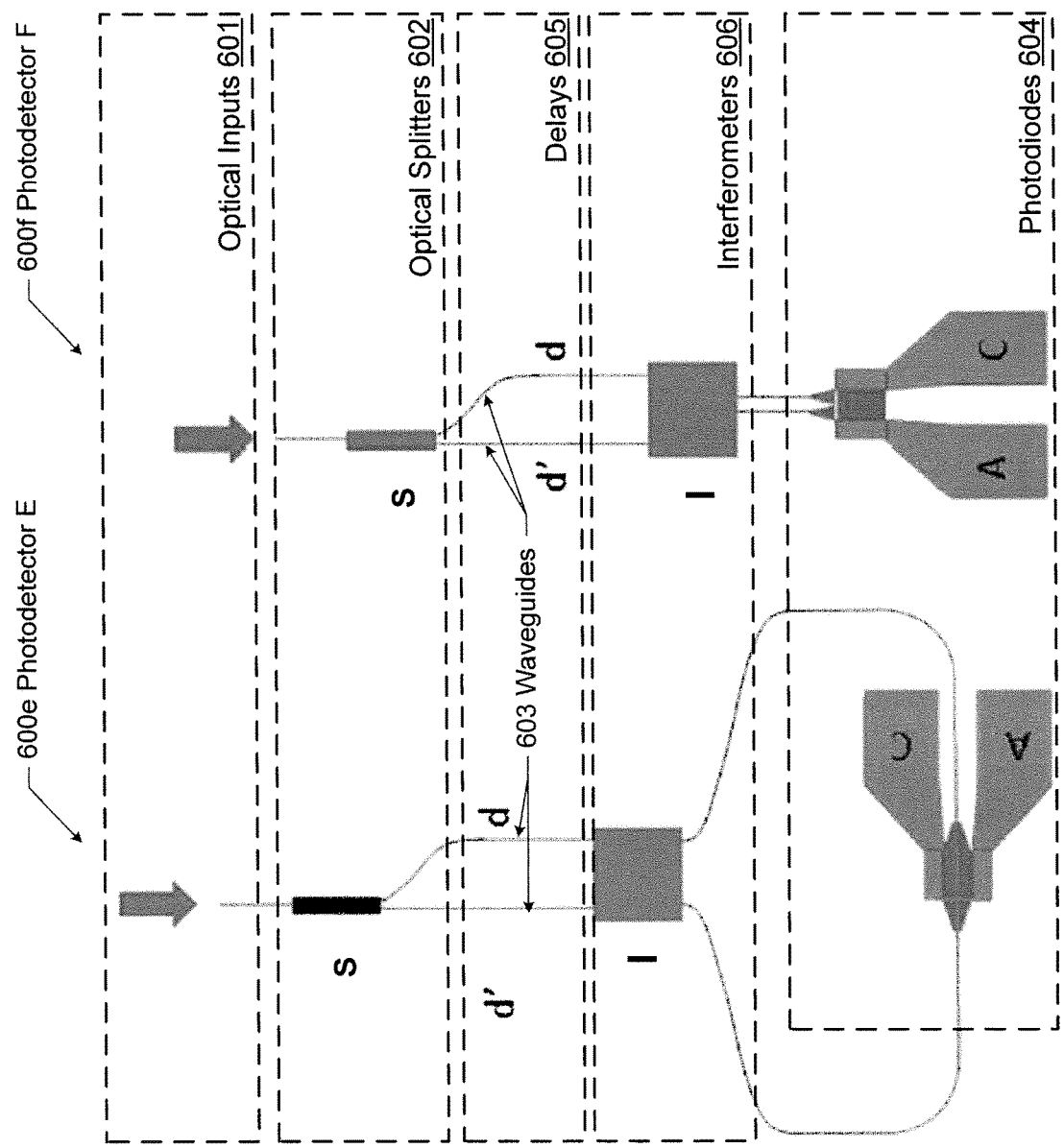

As further noted above, optical waveguide A (103*a*) may be coupled to side A (101*a*) via a number of intervening optical waveguides. In one or more embodiments, each intervening optical waveguide is associated with a length-based optical signal propagation delay and acts as an optical delay element. In one or more embodiments, a delay difference between the intervening optical waveguides can induce a frequency dependent phase shift (e.g., between optical signal A (102*a*) and optical signal B (102*b*)) which can reduce an out-of-band frequency response of the photocurrent generated by the p-n junction (101*b*). An example of such embodiments is depicted in FIGS. 6-8 described below.

In one or more embodiments, photodetector circuit A (100*a*) may be fabricated using integrated photonics technology, potentially in conjunction with flip-chip technology.

Figure 2:
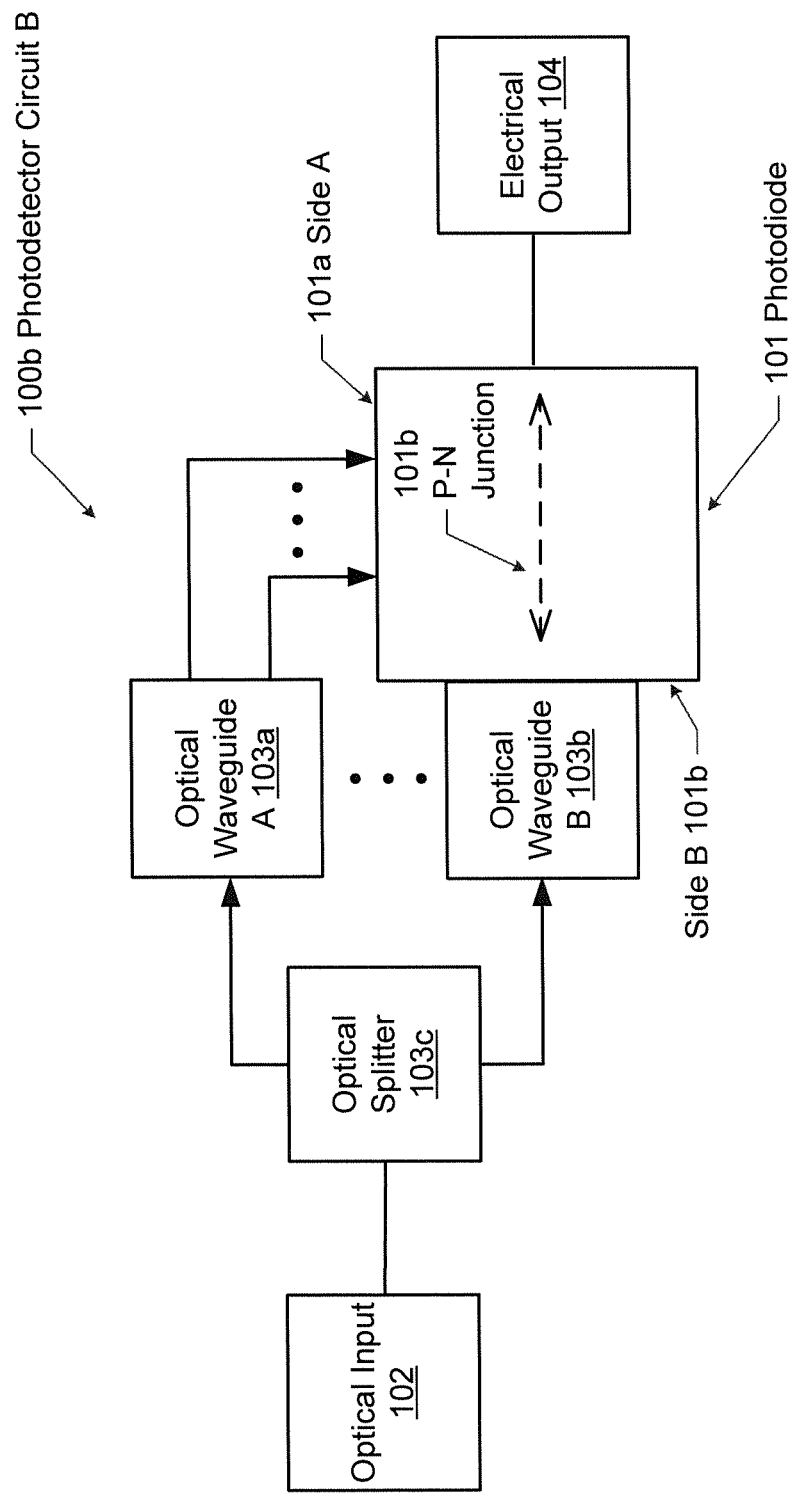

FIG. 2 shows a diagram of a photodetector circuit B (100*b*) in accordance with one or more embodiments disclosed herein. Photodetector circuit B (100*b*) includes substantially the same components as photodetector circuit A (100*a*), with the addition of an optical waveguide B (103*b*) and optical splitter (103*c*). The optical splitter (103*c*) is an optical device that splits a light beam into two separate light beams, where each light beam carries a corresponding optical signal. As used herein, the terms "light beam" and "optical signal" may be used interchangeably unless indicated otherwise. In particular, optical waveguide A (103*a*) is coupled to side A (101*a*) of the photodiode (101) via intervening components, such as one or more intervening waveguides, interferometers, etc. Optical waveguide B (103*b*) is coupled to a different side (i.e., side B (101*b*)) of the photodiode (101). Accordingly, a single photodiode (101) is illuminated on multiple sides, side A (101*a*) and side B (101*b*). Examples of illuminating the photodiode from multiple sides is depicted in FIGS. 4C, 6, and 7 described below. In one or more embodiments, photodetector circuit B (100*b*) may be fabricated using integrated photonics technology, potentially in conjunction with flip-chip technology.

Figure 3A:
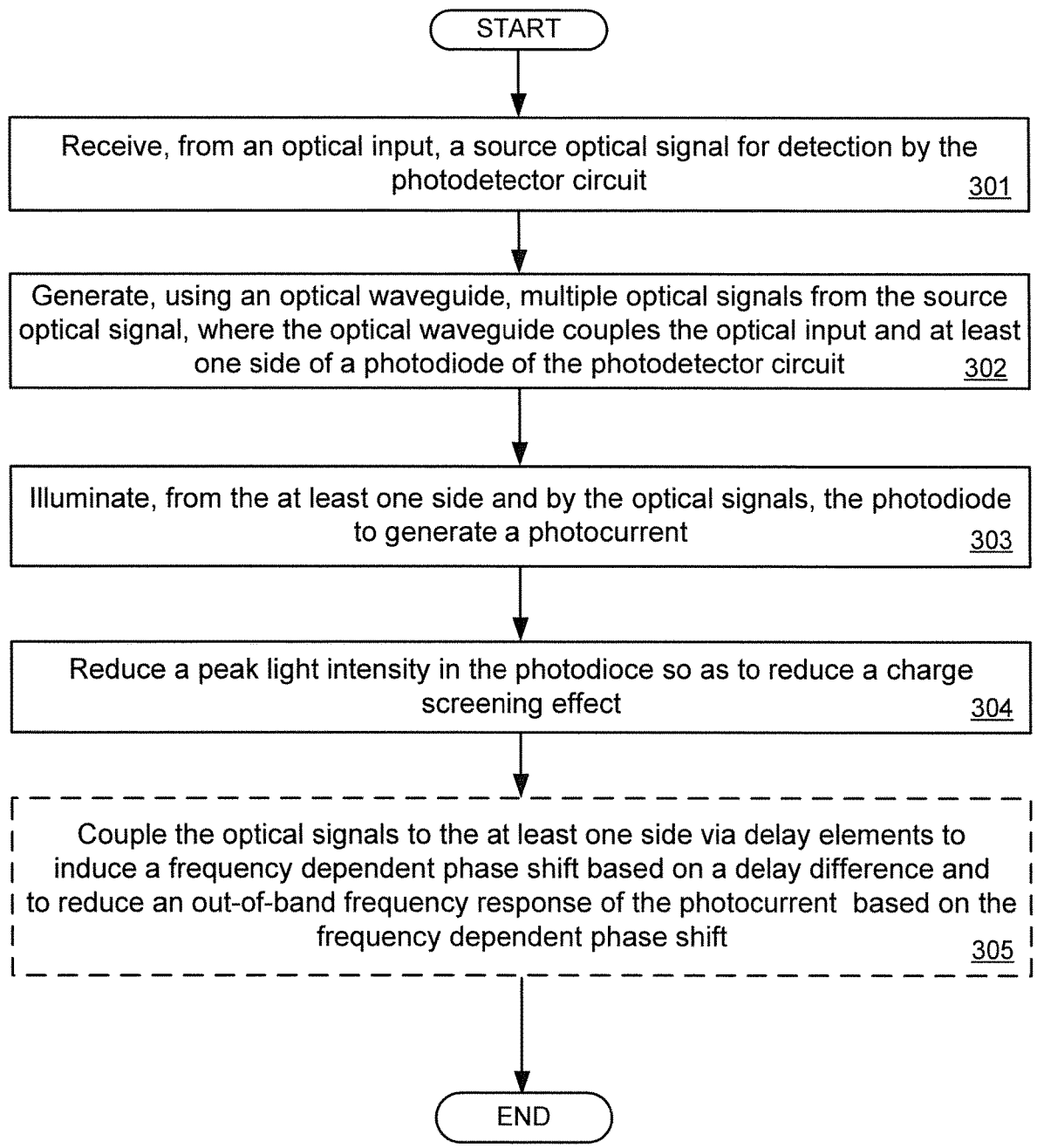
FIGS. 3A and 3B show method flowcharts in accordance with one or more embodiments disclosed herein.

FIG. 3A shows a flowchart in accordance with one or more embodiments. In one or more embodiments, the method may be based on one or more photodetector circuits as depicted in FIGS. 1-2 above. One or more steps shown in FIG. 3A may be omitted, repeated, and/or performed in a different order among different embodiments. Accordingly, embodiments disclosed herein should not be considered limited to the specific number and arrangement of steps shown in FIG. 3A.

Initially in Step 301, a source optical signal is received, from an optical input, for detection by a photodetector circuit. The source optical signal may be an incident light beam, for example.

In Step 302, using an optical waveguide, multiple optical signals are generated from the source optical signal. Specifically, the source optical signal may be split by a beam splitter into two or more optical signals. In one or more embodiments, the optical waveguide is configured to couple the optical input and at least one side of a photodiode. In one or more embodiments, the optical signals may be coupled to multiple sides of the photodiode using multiple waveguides.

In Step 303, the photodiode is illuminated to generate a photocurrent in a p-n junction of the photodiode. The photo current in turn generates an electrical output signal of the photodetector circuit. Specifically, the two or more optical signals are sent to one or more optical input ports on at least one side of a single photodiode. Those skilled in the art will appreciate that multiple sides of the single photodiode may also be illuminated, when the multiple optical signals are sent to one or more optical input ports on more than one side of the single photodiode.

In Step 304, in response to illuminating the p-n junction by the optical signals, a peak light intensity in an active area of the p-n junction is reduced so as to reduce a charge screening effect in the p-n junction. The active area is the region where photons are absorbed. In one or more embodiments, the active area may be germanium. In one or more embodiments, the peak light intensity is reduced by physically separating the optical signals across surface area of one or more sides of the photodiode. For example, sending the optical signals to more than one side of the single photodiode reduces the peak light intensity and results in a more uniform illumination of the photodiode. In one or more embodiments, the peak light intensity is reduced by selecting the length of the optical waveguide where multimode interference produces a substantially even light distribution pattern across the surface area of the at least one side.

In Step 305, optionally, the optical signals are coupled to the one or more sides of the photodiode via delay elements, such as intervening optical waveguides. As a result of the delay difference among the delay elements, a frequency dependent phase shift is induced between the optical signals to cause an interference effect for reducing an out-of-band frequency response of the photodetector circuit. In one or more embodiments, an interferometer is inserted between the delay elements and the one or more sides of the photodiode to induce the interference effect.

Figure 3B:
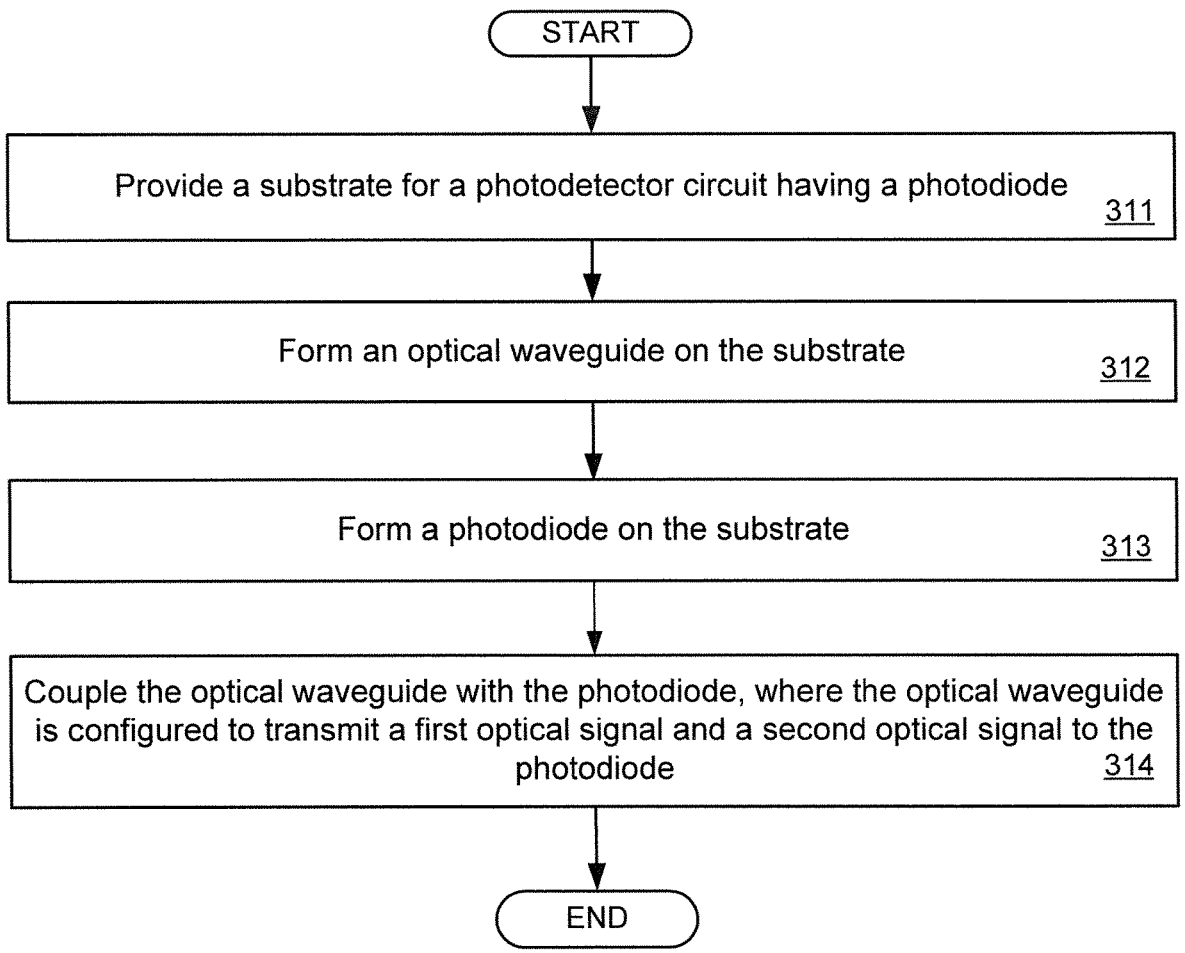

FIG. 3B shows a flowchart in accordance with one or more embodiments. In one or more embodiments, the method of FIG. 3B may be used to manufacture one or more photodetector circuits depicted in FIGS. 1-2 above. One or more manufacturing steps shown in FIG. 3B may be repeated, and/or performed in a different order among different embodiments. Accordingly, embodiments disclosed herein should not be considered limited to the specific number and arrangement of steps shown in FIG. 3B.

Initially in Step 311, a substrate is provided for fabricating a photodetector circuit in accordance with one or more embodiments. The substrate may be a silicon-on-insulator (SoI) wafer or any other applicable wafer-type.

In Step 312, an optical waveguide is formed on the substrate of the photodetector circuit in accordance with one or more embodiments. For example, in the case of a SOI wafer, the top silicon layer is directly etched to form the optical waveguides. In another example, a thin film layer may be deposited on the substrate for the photodetector circuit. The thin film layer may be etched into the optical waveguide using chemically assisted plasma or a wet chemical microfabrication process. In one or more embodiments, the thin film is etched into a portion of an optical splitter. The optical waveguide may also be a silicon nitride waveguide (or an arrangement of silicon nitride rods supporting an optical mode) which can receive the light directly from an optical fiber. The light can also be carried initially in a silicon waveguide and be evanescently coupled to such silicon nitride waveguide (or such arrangement of silicon nitride rods supporting an optical mode).

Step 313 includes the formation of a photodiode on the substrate. This can include a germanium (Ge) layer grown on top of the silicon (Si) and patterned into a Ge-on-Si photodiode, and integrating implantation steps of p and n-type ions in the germanium and/or the silicon regions. The implantation steps are used to define a pn junction or a p-i-n junction, the latter comprising an intrinsic region between the p and n-type implanted regions. It is understood that electrical contacts are fabricated onto the photodiode to allow the electric charges generated by light absorption to be delivered through the p and n-doped regions to output cathode and anode terminals. The photodiode can also take the form of a flip chipped device onto a passive optical integrated circuit.

Step 314 illustrates forming a coupling from the optical waveguide to the at least one side of the photodiode. The coupling of the optical waveguide to the photodiode allows the optical waveguide to transmit one or more optical signals to the corresponding coupled side of the photodiode. Those skilled in the art will appreciate that the process of FIG. 3B may include forming multiple optical waveguides on the substrate, each of which may be coupled to a same or different side of the same photodiode. This allows for uniform illumination of an active area of the photodiode.

The coupling of step 314 can be based on evanescent coupling, where the light carried in the silicon optical waveguide enters the patterned silicon region under the germanium and is evanescently coupled upwards into the overgrown germanium layer, to be absorbed therein. Another coupling implementation includes butt-coupling the silicon optical waveguide directly into the germanium layer (or other absorbing material). In the latter case, the germanium is grown on a recessed silicon layer so that light can enter directly into the germanium area from the silicon optical waveguide. Yet another implementation includes making use of a silicon or silicon nitride waveguide (which might itself be formed by a series of rods supporting an optical mode) running above or sideways of the germanium region. With a sufficiently small distance between the silicon or silicon nitride waveguide(s) and the germanium region, evanescent optical coupling can occur. While not shown in FIG. 3B, additional manufacturing steps may be employed for top side coupling, for example using flip-chip manufacturing steps.

In the previous description, it is understood that the waveguide(s) can be forming of any suitable material other than those mentioned above, and that the photodiode can be made using germanium or any other absorbing material at the wavelength of interest. The invention is not restricted to these specific examples, which are only meant to illustrate fabrication method examples.

In one or more embodiments, the optical waveguide A (103*a*) is a multi-mode interferometer (MMI) where multiple optical signals have different propagation modes that collectively form a light intensity distribution across the side of the photodiode. In particular, the length of the MMI along a light propagation direction from the optical input to the side of the photodiode is selected to increase uniformity of the light intensity distribution across the side of the photodiode.

In one or more embodiments, the optical waveguide is coupled to one side of the photodiode via a number of delay elements. In particular, a delay difference of the delay elements is selected to induce a frequency dependent phase shift of the first and second optical signals for reducing an out-of-band frequency response of the photodetector circuit. In one or more embodiments, an interferometer is inserted between the delay elements and the side of the photodiode to induce an interference effect of the first and second optical signals based on the frequency dependent phase shift.

FIGS. 4A, 4B, 4C, 5, 6, 7, 8, and 9 show example implementations in accordance with one or more embodiments. In one or more embodiments, the examples may be based on one or more photodetector circuits depicted in FIGS. 1-2 above and/or one or more method flow charts depicted in FIGS. 3A-3B above.

Figure 4B:
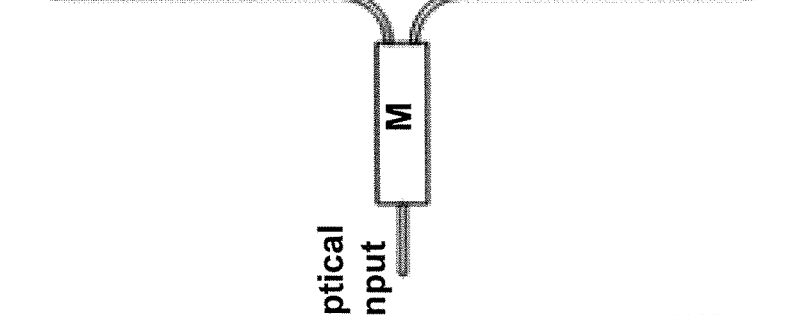
Figure 4A:
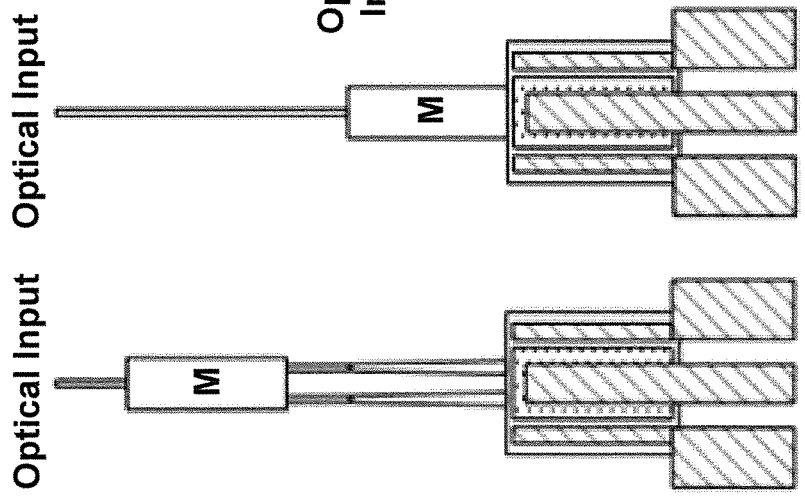

Specifically, FIGS. 4A-4C show a number of implementations for illuminating a photodiode according to the legend (400). In the examples of FIGS. 4A-4C, the implementations reduce the saturation effect in germanium-on-silicon photodiodes by either using multiple optical input ports on at least one side of the photodiode, or using a truncated MMI providing improved uniform illumination across a photodiode entrance face. One or more MMI splitters shown in FIGS. 4A-4C may correspond to optical waveguide A (103*a*) and/or optical waveguide B (103*b*) depicted in FIGS. 1-2 above. In particular, the examples shown reduce the peak intensity within the active area (i.e., germanium) to reduce the charge screening effect. The reduced peak intensity in turn reduces the local density of electron-hole pairs within the photodiode to mitigate the bias voltage screening effect. Although the implementation examples shown in FIGS. 4A-4C refers to germanium-on-silicon photodiodes, other semiconductor material may also be used to form the photodiodes. For example, any active material such as InGaAsP, silicon at visible wavelengths, etc., may be used to form the photodiodes. In addition, light may be coupled directly into the germanium, without use of germanium-on-silicon photodiodes. Further, embodiments disclosed herein are not limited to the C-band wavelength (1.55 um) for germanium. Germanium may be used for wavelengths in the range of 1.2 to 1.6 um.

FIG. 4A shows the use of a 1×2 MMI splitter having two output waveguides coupled to a single input side of the photodiode. This allows reducing the peak intensity by a factor of 2 compared to using a single waveguide having the same output width. In similar examples, the source optical signal may be split into more than two optical paths, e.g., using a 1×N MMI splitter coupled to N output waveguides. In one or more embodiments, the germanium width may be increased to provide multiple optical input ports for accommodating the multiple optical paths from the 1×N MMI splitter.

Additional sides (e.g., back face, top face, etc.) of the photodiode may also be used to further reduce the local peak intensities using the implementation described above. FIGS. 4B and 4C show the MMI being connected directly to the input side of the photodiode. FIG. 4C shows an 1×2 optical splitter used upstream with each of the two optical outputs connected to a 1×2 MMI splitter to collectively illuminate both the front side and back side of the photodiode. The example of FIG. 4C provides a reduction of the peak light intensity by a factor of 4. In a different example, the germanium may be illuminated from the top side by coupling the light from the silicon waveguide to a silicon nitride waveguide (e.g., with a multi-rod structure) disposed over the germanium region where the light is coupled to the photodiode for detection through evanescent coupling.

FIG. 5 shows light intensity distributions 501-506 across the lateral positions and longitudinal positions within the MMI. In particular, the longitudinal positions are along the light propagation direction of the MMI. The light intensity distribution (504) exhibits improved uniformity over the other light intensity distributions 501-503 and 505-506. In one or more embodiments, the MMI is truncated at the truncated face (500a) corresponding to the light intensity distribution (504) prior to being coupled to the photodiode. Accordingly, the truncated MMI (500) is used to couple the optical input (102) to the input side of the photodiode (101). In other words, the input side of the photodiode (101) is illuminated based on the light intensity distribution (504) having improved uniformity. With the use of the truncated MMI (500), the electronic charges generated in the active area of the photodiode at a position corresponding to the center of the light intensity distribution (504) travel a longer distance to reach the side electrode of the photodiode. This may result in slightly lower speed of operation of the photodiode (101). Regarding this aspect, a dual-fed photodiode with the two optical waveguides on the same input side and same lateral offset from the center axis of the photodiode may be used to provide an equal travel time for all charges generated within the photodiode.

In the examples described above with respect to FIGS. 4A-4C, the light intensity, and therefore the saturation effect, is reduced to improve linearity, harmonic distortion, and frequency response (i.e. bandwidth) of the photo detector through reduction of the bias voltage screening in the photodiode. Any combination of the examples shown in FIG. 4A-4C may also be used. For example, an 1×N MMI splitter may be coupled to the front side and a truncated MMI splitter, as a single waveguide, may be coupled to the back side of the photodiode. Although 1×2 MMI splitter is shown in FIG. 4A-4C, the MMI splitter may be substituted by a 1×N MMI splitter or by any other type of splitting element, where applicable.

FIG. 6 shows a number of example configurations for reducing an out-of-band frequency response of a photodetector circuit, denoted as photodetector A (600a) through photodetector D (600d). Each of the implementations includes an optical input (601), optical splitter (602), waveguides (603), and photodiode (604), where the delays (605) are associated with waveguides (603). One or more optical splitters (602) shown in FIG. 6 may correspond to optical waveguide A (103a) and/or optical waveguide B (103b) depicted in FIGS. 1-2 above. The examples reduce the out-of-band frequency response by inducing a frequency dependent phase shift between optical signals carried by light beams illuminating the photodiode (604). Specifically, the optical signals are coupled to the photodiode (604) using intervening optical waveguides (603) having different optical signal propagation delays (605), e.g., based on different waveguide lengths.

In the examples shown in FIG. 6, the optical signals with different delays (605) are combined in the photodiode (604). Specifically, the delays (d, d', d'', d''') are realized by using different lengths for the waveguides (603). For example, in the examples shown in FIG. 6, photodetector A (600a) employs two delay elements (d, d'), photodetector B (600b) employs three delay elements (d, d', d''), photodetector C (600c) employs three delay elements (d, d', d''), and photodetector D (600d) employs four separate delay elements (e.g., d, d', d'', d''').

FIG. 7 shows a number of example configurations for reducing an out-of-band frequency response of a photodetector circuit, denoted as photodetector E (600e) and photodetector F (6000). Each of the implementations includes an optical input (601), optical splitter (602), waveguides (603), interferometer (606), and photodiode (604), where the delays (605) are associated with waveguides (603). One or more optical splitters (602) shown in FIG. 7 may correspond to optical waveguide A (103a) and/or optical waveguide B (103b) depicted in FIGS. 1-2 above. The examples reduce the out-of-band frequency response by inducing a frequency dependent phase shift between optical signals carried by light beams illuminating the photodiode (604). Specifically, the optical signals are coupled to the photodiode (604) using intervening optical waveguides (603) having different optical signal propagation delays (605), e.g., based on different waveguide lengths. The optical signals with different delays (605) are then combined such that high frequency components are reduced due to destructive interference based on the frequency dependent phase shift in the interferometer (606) upstream to the photodiode (604).

In some of the examples shown in FIGS. 6-7, the individual optical waveguides (603) are coupled to opposite sides of the photodiode (604). However, the optical waveguides (603) may also be coupled to the same side (FIG. 7) without being recombined optically prior to detection. Further, the designation of cathode "C" and anode "A" to the central and side electrodes as illustrated herein is arbitrary, and only depends on the atomic species used to dope the silicon and germanium.

In the case of the single entry photodiode, the output photocurrent includes a DC current and the modulation signal $i_{mod}(t)$. In an application example of coherent detection, $i_{mod}(t)$ may be the heterodyne signal produced by the beating between a phase modulated input signal (received) and a local oscillator. In other examples, other types of light modulation such as intensity modulation may also be used. In the case of the dual-entry photodiode, both optical inputs generate respective photocurrent contributions (DC and modulation) that are added within the photodiode to produce the total output photocurrent. As the optical waveguides have different delays (e.g., d, d', d'', d''') from the optical splitter to the photodiode, the individual contributions from the two optical paths are delayed with respect to each other in time. As a result, low frequency components from the two optical inputs are summed in phase, while high frequency components are summed with phase difference in the delayed signals. As a result, RF fading of the high frequency components in the modulated signal occurs. At a specific frequency, the contributions may be out of phase and cancel each other in the output photocurrent generated by the photodetector. Aside from the DC photocurrent, the modulation signal output of the photodiode can be represented as $$i_{out}(t) = i_{front}(t) + i_{back}(t)$$

where $i_{front}(t)$ and $i_{back}(t)$ are the modulation currents produced within the photodiode by the optical signals reaching the front and back sides of the photodiode respectively. As noted above, the two optical inputs of the photodiode may also be located on the same side of the photodiode. Let $\Delta t$ represent a delay between the time of arrival of the signals at the front and back sides of the photodiode:

$$\Delta t = \Delta t_{front} - \Delta t_{back}$$

Here $\Delta t_{front}$ and $\Delta t_{back}$ are the propagation times of the optical signals from the optical splitter output to the front and back entry points of the photodiode, respectively. Splitting optical power between the two optical paths into equal amounts may be represented by the equations below:

$$i_{front}(t) = \tfrac{1}{2} i_{mod}(t)$$

$$i_{back}(t) = \tfrac{1}{2} i_{mod}(t + \Delta t)$$

$$i_{out}(t) = \tfrac{1}{2} i_{mod}(t) + \tfrac{1}{2} i_{mod}(t + \Delta t)$$

In the frequency domain, the total modulated photocurrent at the output of the photodiode may be expressed as:

$$i_{out}(f) = \frac{1}{2} \int_{-\infty}^{\infty} i_{mod}(t) e^{-i 2\pi f t} \, dt + \frac{1}{2} \int_{-\infty}^{\infty} i_{mod}(t + \Delta t) e^{-i 2\pi f t} \, dt$$

$$= \frac{1}{2} \hat{i}_{mod}(f) + \frac{1}{2} e^{i 2\pi f \Delta t} \hat{i}_{mod}(f)$$

where $\hat{i}_{mod}(f)$ is the modulation current expressed in the frequency domain. The power spectral density (PSD) of the modulation signal at the photodiode output is thus given by:

$$s_{i,out}(f) = S_{mod}(f) \cos^2(\pi f \Delta t)$$

with $S_{mod}(f)$ being the PSD of the modulation signal. From the previous equations, the fading of the modulation signal, varying as $\cos^2(\pi f \Delta t)$, is induced by the intentional mismatch in the optical paths between the optical splitter and photodiode. The photocurrent may also be filtered further by the limited bandwidth of the photodiode, which is not explicitly included in the equations above.

Similar to the dual fed photodiodes described above, the photodiode may also be illuminated by multiple beams from any side and any direction, each beam providing a replica of the incoming optical signal to the photodiode with a respective propagation time delay between the optical splitter output to the photodiode. Moreover, the optical splitter may not divide the source optical signal in equal proportions among the multiple beams. In other words, each beam may contain a distinct fraction of the optical power of the initial incoming beam.

For a n-fed photodiode, the optical splitter may be implemented using 1×n MMI couplers. Other types of optical splitters may also be used such as to provide an uneven partitioning of the incoming optical power among the n-outputs. Several splitters in series (not shown) may also be used for the splitting function, e.g., using a 1×2 coupler followed by two 1×2 couplers to implement a 4-way splitting function. Using multiple paths to the photodiode and uneven optical power partitioning between different paths allows further shaping of the photodetector frequency response. The output current from the photodiode is the sum of all contributions produced by the delayed optical signals:

$$i_{out}(t) = \sum_{k=1}^{n} A_k i(t + \Delta t_k)$$

where n is the number of paths going from the splitting element to the photodiode, $A_k$ is the fraction of optical power going into path k and $\Delta t_k$ is the corresponding optical delay. The power spectral density of the modulation signal at the photodiode output is given by:

$$S_{i,out}(f) = S_{mod}(f) \left| \sum_{k=1}^{n} A_k e^{i 2\pi f \Delta t_k} \right|^2$$

The examples described above are also applicable to photodiodes that are not fabricated as integrated optics, e.g., flip-chip photodiodes may also be used. For example, a photodiode die can be mounted as a flip-chip component onto a passive optical circuit comprising the optical splitter and optical waveguides (of dissimilar lengths). The optical waveguides can, for example, route two split optical signals to a 45° etched mirror that directs the light to the flip-chip photodiode. Note that a single mirror may be used as long as the beams are separate beams prior to detection. The beams may be made incident onto the photodiode at the same location. The generated spatial fringes do not impede the implementations described above.

Figure 8A:
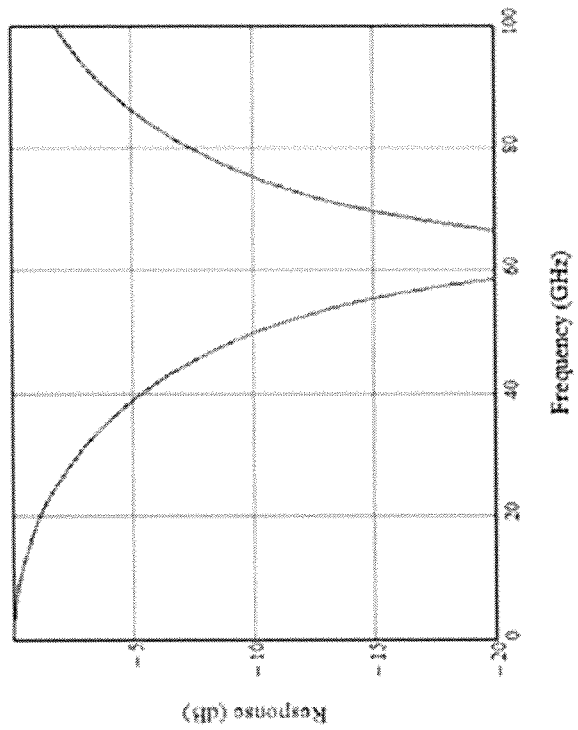
Figure 8A:
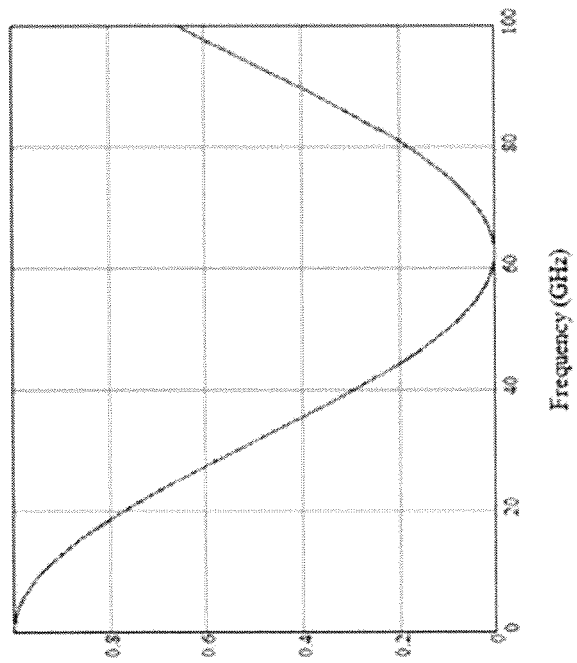

FIG. 8A shows the RF fading on a linear scale (left) and on a logarithmic scale (right) in the case of a time delay ($\Delta t$) of 8 ps (picoseconds) between the two optical paths from the optical splitter output to the photodiode.

Figure 8B:
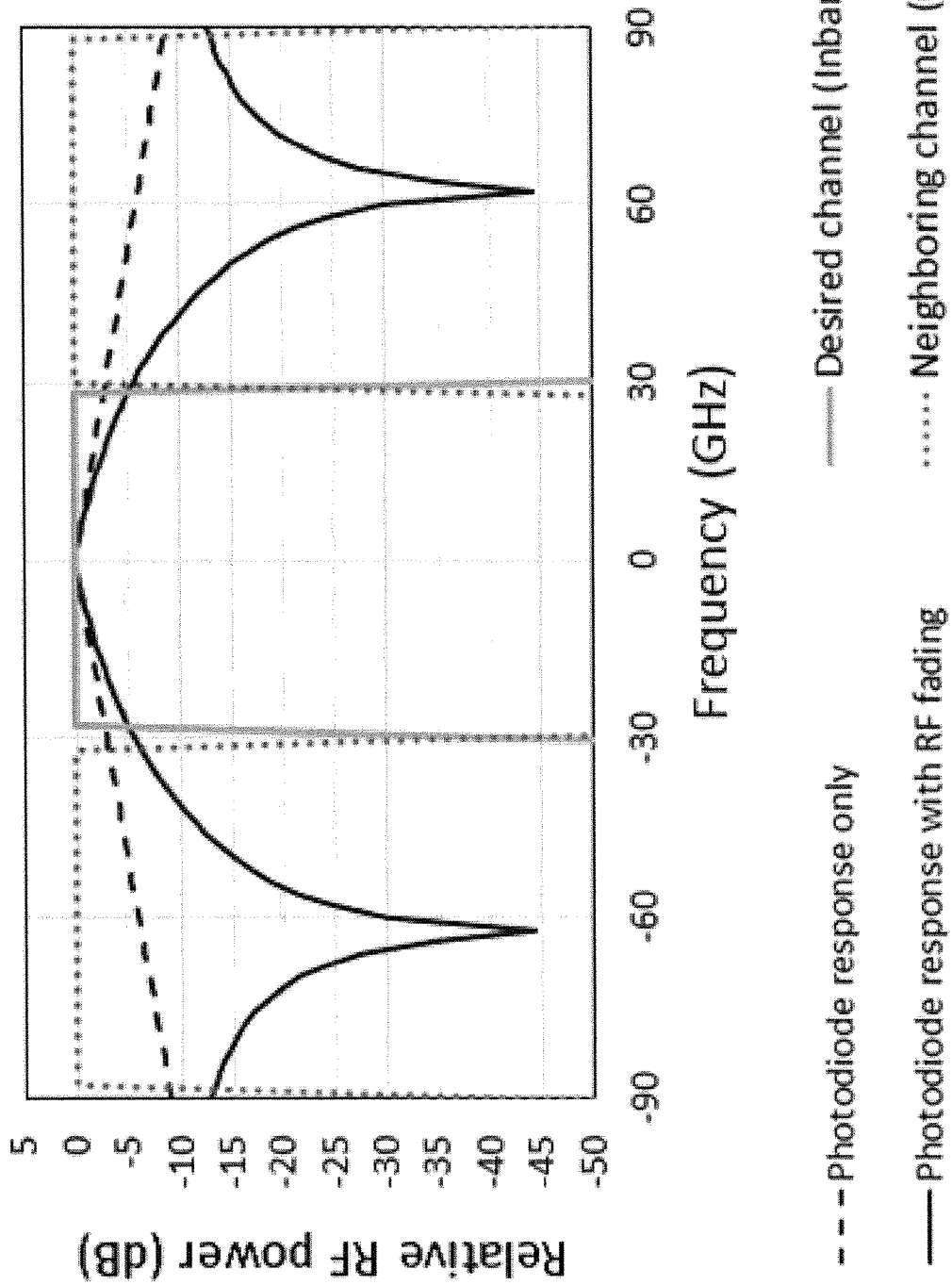

FIG. 8B shows the response of a photodiode with and without the RF fading brought by the optical method proposed above. The response of the photodiode only is shown by the dashed black curve while the response of the photodiode with the proposed method is shown by the solid black curve. The spectral bandwidth corresponding to the channel to be detected (desired channel containing the in-band data) is illustrated by the solid gray curve, while the spectral bandwidth corresponding to the neighboring channel (undesired out-of-band channel) is given by the dotted gray curve. It is clearly seen that the RF fading (difference between the solid and dashed black curves) produced by the optical method proposed herein rejects the out-of-band channel by a significant amount. The optical method producing the RF fading described above not only shapes the desired signal for a photodetector but also suppresses the common mode signal of a balanced photodetector which may occur as a result of assembly tolerances (e.g., mismatch in wire bond lengths).

Figure 9:
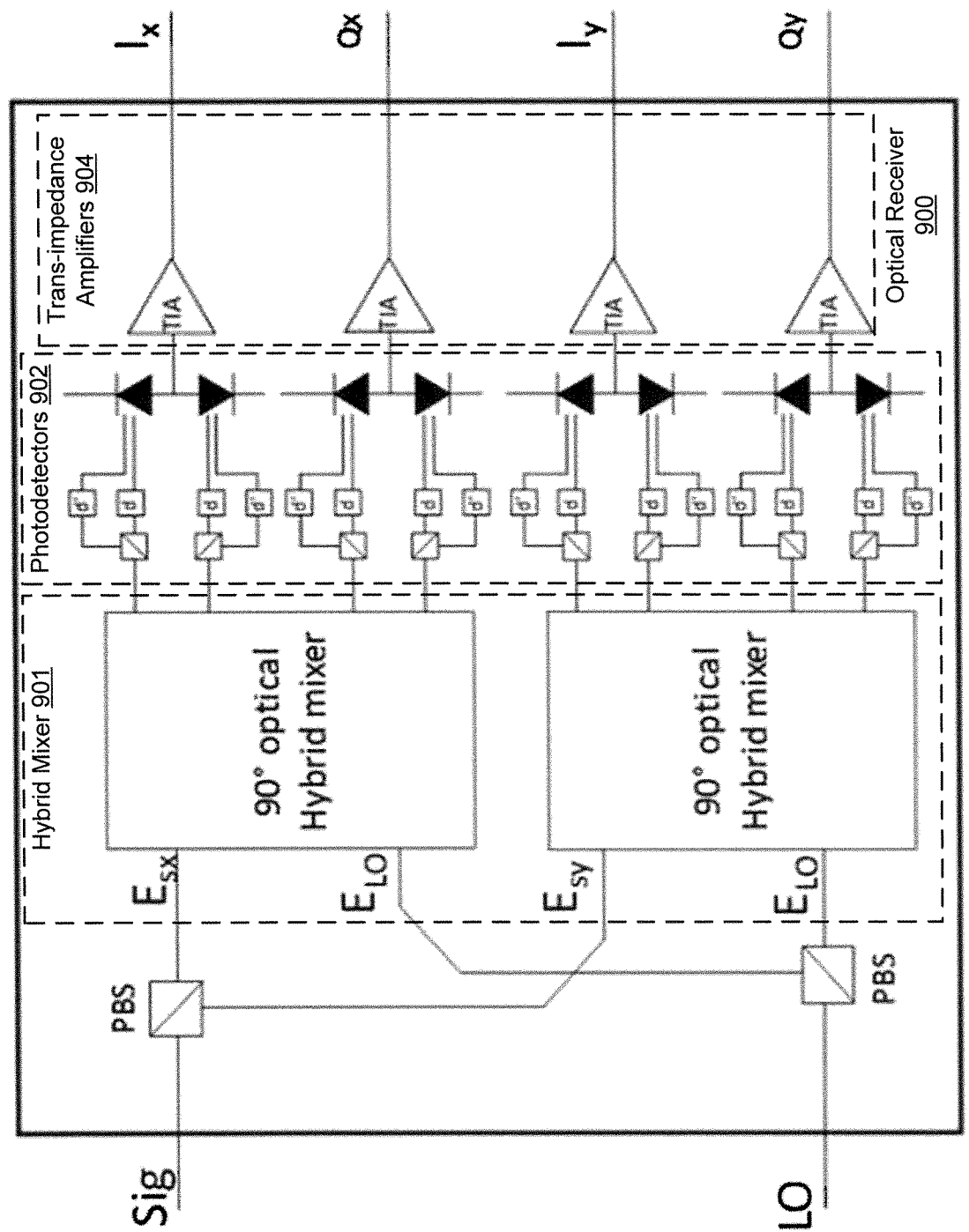

FIG. 9 shows an example schematic diagram of an optical receiver (900), which is an Integrated Intradyne Coherent Receiver (ICR). In one or more embodiments, the embodiments described in reference to FIGS. 1-8B above are used to implement the photodetectors (902) in the optical front end of the optical receiver (900). In particular, the inputs of the optical receiver (900) are denoted as Sig (signal) and LO (local oscillator), while the outputs are denoted as $I_x$, $Q_x$, $I_y$, and $Q_y$. The split function and optical delay to achieve the RF fading is introduced between the hybrid mixer (901) and the photodetectors (902) within the optical receiver (900) and optical path lengths between the components. The output amplifiers (904) are denoted as TIA (trans-impedance amplifier) that convert the photocurrents of the photodetectors (902) into electrical output signals.

With no RF fading, the input transistor of the TIA is virtually receiving the same amount of neighboring out-of-band channel power as the in-band channel. As a result, the TIA front end may become over-saturated, or may have to be overdesigned leading to tradeoffs in thermal noise performance. The optical method to induce the RF fading described above mitigates the over-saturation and resultant effects.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A photodetector circuit, comprising:
   an optical input configured to receive a source optical signal for detection by the photodetector circuit;
   a first optical waveguide for coupling the optical input and at least one side of a plurality of sides of a photodiode, wherein the first optical waveguide is configured to generate a first optical signal and a second optical signal from the source optical signal; and
   the photodiode coupled to the first optical waveguide and comprising the plurality of sides, wherein the photodiode is illuminated on the at least one side by the first and second optical signals at different locations on the photodiode,
   wherein the photodiode generates a photocurrent based on the first and second optical signals, wherein the first and second optical signals are configured to reduce photocurrent saturation in the photodiode.

2. The photodetector circuit of claim 1,
   wherein the photodiode comprises a first optical input location and a second optical input location on the at least one side, and
   wherein the first optical waveguide transmits the first optical signal to the first optical input location, and the first optical waveguide transmits the second optical signal to the second optical input location of the photodiode.

3. The photodetector circuit of claim 1,
   wherein the photodiode has a germanium region and a silicon region,
   wherein the photodiode comprises at least one junction selected from a group consisting of a lateral p-n junction, a vertical p-n junction, a lateral p-i-n junction, and a vertical p-i-n junction, and
   wherein the first optical waveguide is coupled to the photodiode via at least one coupling selected from a group consisting of butt-coupling and evanescent coupling.

4. The photodetector circuit of claim 1,
   wherein the first optical waveguide is coupled to the at least one side via a plurality of delay elements,
   wherein the plurality of delay elements comprise a delay difference that induces a frequency dependent phase shift of the first optical signal and the second optical signal, and
   wherein illuminating the photodiode with the first and second optical signals reduces an out-of-band frequency response of the photocurrent based on the frequency dependent phase shift.

5. The photodetector circuit of claim 1,
   wherein the first optical waveguide is coupled directly to the at least one side or coupled to an active region of the at least one side using evanescent coupling or butt-coupling,
   wherein the first and second optical signals comprise a plurality of propagation modes that collectively form a light intensity distribution across the at least one side,
   wherein the first optical waveguide comprises a truncated multimode interferometer having a length along a light propagation direction from the optical input to a first side of the photodiode, the length being selected to increase uniformity of the light intensity distribution across the first side of the photodiode.

6. The photodetector circuit of claim 1,
   wherein the first optical waveguide comprises a multimode interference splitter,
   wherein the first and second optical signals are coupled to different positions across a first side of the photodiode using at least one waveguide selected from a group consisting of a tapered waveguide and a uniform waveguide.

7. The photodetector circuit of claim 1, further comprising:
   a second optical waveguide coupling the optical input and a second side of the plurality of sides of the photodiode, wherein the second optical waveguide is configured to generate a third optical signal from the source optical signal, and
   an optical splitter connected to the first optical waveguide and the second optical waveguide, wherein coupling to the optical input is through the optical splitter,
   wherein the photodiode is further illuminated on the second side by the third optical signal.

8. The photodetector circuit of claim 1,
   wherein the first optical signal has a first fraction of a total incident optical power and the second optical signal has a second fraction of the total incident optical power,
   wherein the first fraction and the second fraction are different.

9. An optical receiver, comprising:
   a photodetector circuit comprising:

an optical input configured to receive a source optical signal for detection by the photodetector circuit;

an optical waveguide for coupling the optical input and at least one side of a plurality of sides of a photodiode, wherein the optical waveguide is configured to generate a first optical signal and a second optical signal from the source optical signal; and the photodiode coupled to the optical waveguide and comprising the plurality of sides, wherein the photodiode is illuminated on the at least one side by the first and second optical signals at different locations on the photodiode, wherein the photodiode generates a photocurrent based on the first and second optical signals, wherein the first and second optical signals are configured to reduce photocurrent saturation in the photodiode; and an amplifier circuit configured to detect the photocurrent and to generate a voltage output of the optical receiver.

10. The optical receiver of claim 9, wherein the optical waveguide is coupled to the at least one side via a plurality of delay elements, wherein the plurality of delay elements comprise a delay difference that induces a frequency dependent phase shift of the first optical signal and the second optical signal, and wherein illuminating the photodiode by the first and second optical signals reduces an out-of-band frequency response of the photocurrent based on the frequency dependent phase shift.

11. The optical receiver of claim 10, further comprising:

an interferometer coupling the plurality of delay elements to the at least one side, wherein the interferometer is configured to induce an interference effect of the first and second optical signals based on the frequency dependent phase shift.

12. The optical receiver of claim 10, wherein the optical waveguide is further coupled to a second side of the plurality of sides of the photodiode via the plurality of delay elements, wherein the photodiode is further illuminated on the second side by the optical waveguide.

13. The optical receiver of claim 9, wherein the optical waveguide is coupled directly to the at least one side or coupled to an active region of the at least one side using evanescent coupling or butt-coupling, wherein the first and second optical signals comprise a plurality of propagation modes that collectively form a light intensity distribution across a first side of the photodiode, and wherein the optical waveguide comprises a length along a light propagation direction from the optical input to the first side of the photodiode, the length being selected to increase uniformity of the light intensity distribution across the first side of the photodiode.

14. The optical receiver of claim 9, wherein the optical waveguide comprises a multimode interference splitter, and wherein the first and second optical signals are coupled to different positions across a first side of the photodiode using at least one tapered waveguide.

15. A method for manufacturing a photodetector circuit, comprising:

providing a substrate for the photodetector circuit;

forming an optical waveguide disposed on the substrate; and coupling the optical waveguide with a photodiode, wherein the optical waveguide is configured to transmit a first optical signal and a second optical signal to the photodiode at different locations on the photodiode, wherein the first and second optical signals are configured to reduce photocurrent saturation in the photodiode.

16. The method of claim 15, wherein the optical waveguide is an optical splitter.

17. The method of claim 15, wherein coupling the optical waveguide with the photodiode comprises:

coupling the optical waveguide to a first side of a plurality of sides of the photodiode using a plurality of waveguides.

18. The method of claim 15, wherein coupling the optical waveguide with the photodiode comprises:

coupling the optical waveguide to at least one side of a plurality of sides of the photodiode, wherein the first and second optical signals comprise a plurality of propagation modes that collectively form a light intensity distribution across the at least one side of the photodiode, and wherein forming the optical waveguide comprises selecting a length along a light propagation direction along the optical waveguide from an optical input to the at least one side, the length being selected to form a truncated multimode interferometer having increased uniformity of the light intensity distribution across the at least one side of the photodiode.

19. The method of claim 15, wherein coupling the optical waveguide with the photodiode comprises:

coupling the optical waveguide to at least one side of a plurality of sides of the photodiode via a plurality of delay elements;

selecting an optical power ratio, among a plurality of optical power ratios, between the first and second optical signals; and selecting a delay difference of the plurality of delay elements to induce a frequency dependent phase shift of the first and second optical signals for reducing an out-of-band frequency response of the photodetector circuit.

20. The method of claim 19, wherein coupling the optical waveguide with the photodiode further comprises:

inserting an interferometer between the plurality of delay elements and the at least one side of the photodiode to induce an interference effect of the first and second optical signals based on the frequency dependent phase shift.

* * * * *